United States Patent
Khlat

(10) Patent No.: US 12,525,924 B2
(45) Date of Patent: Jan. 13, 2026

(54) ENVELOPE TRACKING RADIO FREQUENCY FRONT-END CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 359 days.

(21) Appl. No.: 18/251,252

(22) PCT Filed: Aug. 23, 2021

(86) PCT No.: PCT/US2021/047092
§ 371 (c)(1),
(2) Date: May 1, 2023

(87) PCT Pub. No.: WO2022/103465
PCT Pub. Date: May 19, 2022

(65) Prior Publication Data
US 2023/0421105 A1 Dec. 28, 2023

Related U.S. Application Data

(60) Provisional application No. 63/112,824, filed on Nov. 12, 2020.

(51) Int. Cl.
*H03F 1/30* (2006.01)
*H03F 1/02* (2006.01)
*H03F 3/195* (2006.01)
*H03F 3/21* (2006.01)
*H03F 3/213* (2006.01)

(52) U.S. Cl.
CPC ............. *H03F 1/025* (2013.01); *H03F 3/195* (2013.01); *H03F 3/211* (2013.01); *H03F 3/213* (2013.01); *H03F 2200/153* (2013.01)

(58) Field of Classification Search
CPC ................ H03F 1/30; H03F 1/02; H03F 3/20
USPC .......................... 330/297, 129, 136, 124 R
See application file for complete search history.

(56) References Cited

U.S. PATENT DOCUMENTS

| | | |
|---|---|---|
| 2019/0181803 A1 | 6/2019 | Chiron et al. |
| 2020/0127607 A1 | 4/2020 | Khlat |
| 2020/0259685 A1 | 8/2020 | Khlat |
| 2020/0274494 A1 | 8/2020 | Khlat |
| 2021/0211108 A1 | 7/2021 | Khlat |

OTHER PUBLICATIONS

International Search Report and Written Opinion for International Patent Application No. PCT/US2021/047092, mailed Jan. 4, 2022, 20 pages.

*Primary Examiner* — Henry Choe
(74) *Attorney, Agent, or Firm* — Withrow & Terranova, P.L.L.C.

(57) ABSTRACT

An envelope tracking (ET) radio frequency (RF) front-end circuit receives a single tracking signal (e.g., Vramp) from a baseband transceiver and generates a plurality of control signals (Vcc). The control signals are created by a multiple control signal generator circuit based on a calculated load estimate for each relevant power amplifier. The load estimate may be calculated from a sensed current and voltage. By providing control signals optimized for loads presented to the power amplifiers, the overall efficiency of the transmitter is improved.

20 Claims, 6 Drawing Sheets

ENVELOPE TRACKING RADIO FREQUENCY FRONT-END CIRCUIT

RELATED APPLICATIONS

This application is a 35 USC 371 national phase filing of International Application No. PCT/US2021/047092, filed Aug. 23, 2021, which claims the benefit of U.S. provisional patent application Ser. No. 63/112,824, filed Nov. 12, 2020, the disclosures of which are incorporated herein by reference in their entireties.

FIELD OF THE DISCLOSURE

The technology of the disclosure relates generally to an envelope tracking (ET) radio frequency (RF) front-end circuit having multiple power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 gigahertz (GHz). Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) simultaneously from multiple antennas using such spatial multiplexing schemes as multiple-input multiple-output (MIMO) and RF beamforming. As such, the 5G-NR mobile communication device needs to employ multiple power amplifiers in an RF front-end module (FEM) to amplify the RF signal(s) before feeding to the multiple antennas.

Envelope tracking (ET) is a power management technique designed to improve operating efficiency of the power amplifiers. Specifically, the power amplifiers simultaneously amplify the RF signal(s) based on multiple ET voltages that track a time-variant power envelope of the RF signal(s). Understandably, the better the ET voltages can track the time-variant power envelope, the more efficient the power amplifier can operate.

Where there are multiple power amplifiers in an RF FEM that in turn serve multiple antennas, it is common for the different antennas to present different loads to the respective power amplifiers. To provide the necessary operation across the desired frequency bandwidth, the ET voltage should be optimized for the load line seen by each power amplifier. While one solution is to provide a unique ET circuit for each power amplifier, such solution is seen as extravagant in terms of cost, area consumed, and power consumed. These commercial pressures motivate alternate solutions.

SUMMARY

Embodiments of the disclosure relate to an envelope tracking (ET) radio frequency (RF) front-end circuit. In an exemplary aspect, a single ET integrated circuit (IC) (ETIC) receives a single tracking signal (e.g., Vramp) from a baseband transceiver and generates a plurality of control signals (Vcc). The control signals are created by a multiple control signal generator circuit based on a calculated load estimate for each relevant power amplifier. The load estimate may be calculated from a sensed current and voltage. By providing control signals optimized for loads presented to the power amplifiers, the overall efficiency of the transmitter is improved.

In one aspect, an ETIC is provided. The ETIC comprises an input configured to receive a vramp signal from a baseband transceiver. The ETIC also comprises an output configured to provide a target input signal to a power amplifier array. The ETIC also comprises a multiple signal generator circuit coupled to the input and configured to generate a control signal based on the received vramp signal and an estimated load for the power amplifier array. The ETIC also comprises a conditioning circuit coupled to the multiple signal generator circuit. The conditioning circuit is configured to receive the control signal and comprises a detection circuit configured to detect a current and a voltage to derive the estimated load to be provided to the multiple signal generator circuit In another aspect, a wireless device is provided. The wireless device comprises a baseband transceiver configured to produce a vramp signal. The wireless device also comprises an ETIC coupled to the baseband transceiver. The ETIC comprises an input configured to receive the vramp signal from the baseband transceiver. The ETIC also comprises an output configured to provide a target input signal to a power amplifier array. The ETIC also comprises a multiple signal generator circuit coupled to the input and configured to generate a control signal based on the received vramp signal and an estimated load for the power amplifier array. The ETIC also comprises a conditioning circuit coupled to the multiple signal generator circuit. The conditioning circuit is configured to receive the control signal and comprises a detection circuit configured to detect a current and a voltage to derive the estimated load to be provided to the multiple signal generator circuit. The wireless device also comprises the power amplifier array coupled to the ETIC.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
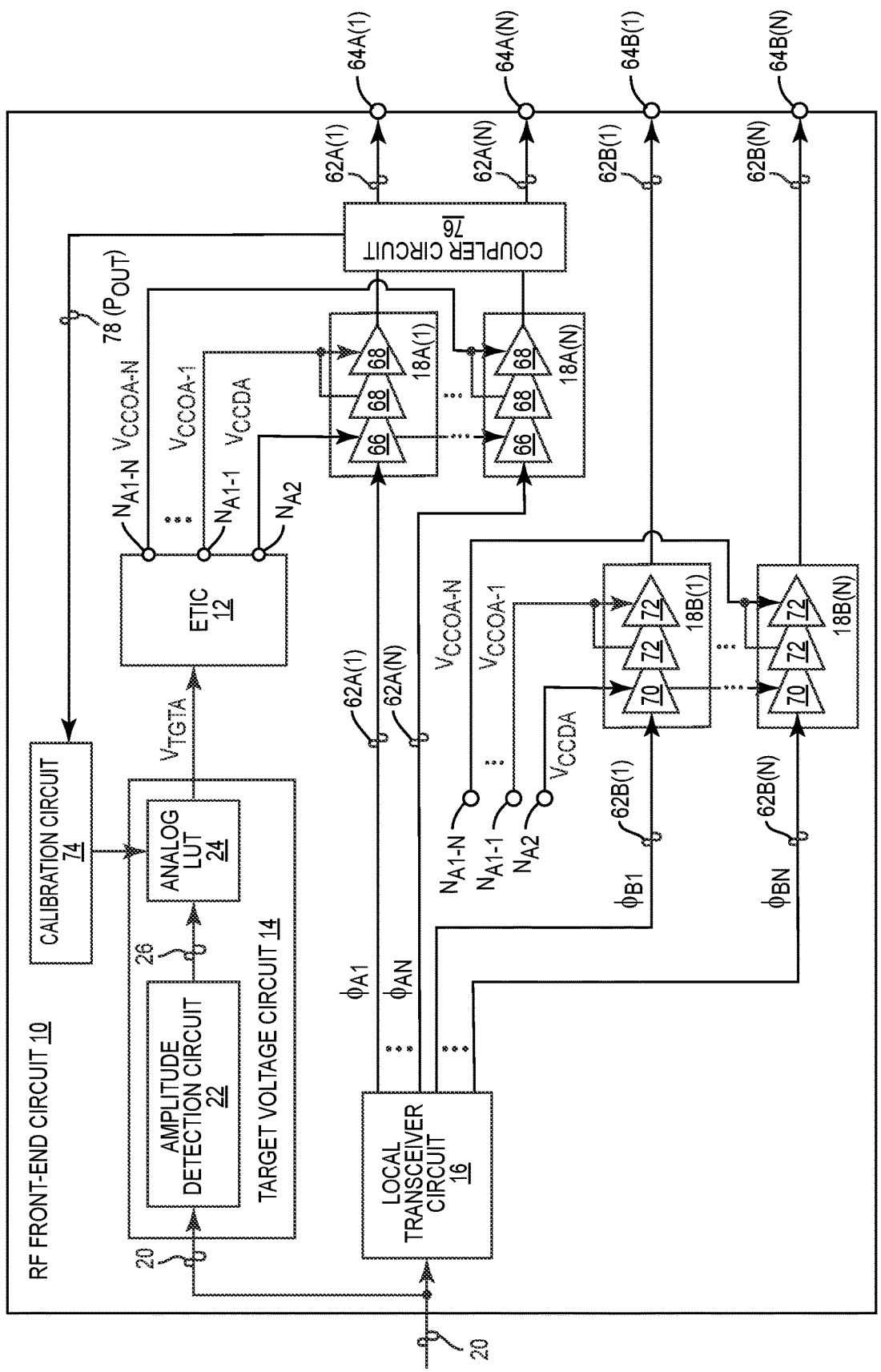
FIG. 1 is a schematic diagram of an exemplary envelope tracking (ET) radio frequency (RF) front-end circuit with power amplifier arrays controlled by an ET integrated circuit (IC) ETIC.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) radio frequency (RF) front-end circuit. In an exemplary aspect, a single ET integrated circuit (IC) (ETIC) receives a single tracking signal (e.g., Vramp) from a baseband transceiver and generates a plurality of control signals (Vcc). The control signals are created by a multiple control signal generator circuit based on a calculated load estimate for each relevant power amplifier. The load estimate may be calculated from a sensed current and voltage. By providing control signals optimized for loads presented to the power amplifiers, the overall efficiency of the transmitter is improved.

FIG. 1 is a schematic diagram of an exemplary ET RF front-end circuit 10 configured according to an aspect of the present disclosure. The ET RF front-end circuit 10 is self-contained in a system-on-chip (SoC) or system-in-package (SiP), as an example, to provide all essential functions of an RF front-end module (FEM). Specifically, the ET RF front-end circuit 10 is configured to include an ETIC 12, a target voltage circuit 14, a local transceiver circuit 16, and a number of power amplifiers 18A(1)-18A(N). The ET RF front-end circuit 10 may also include a number of second power amplifiers 18B(1)-18B(N). By packaging the ETIC 12, the target voltage circuit 14, the local transceiver circuit 16, the power amplifiers 18A(1)-18A(N), and the second power amplifiers 18B(1)-18B(N) into the ET RF front-end circuit 10, it is possible to reduce distance-related distortion in the aforementioned conventional implementation, thus helping to improve operating efficiency and linearity of the power amplifiers 18A(1)-18A(N), 18B(1)-18B(N).

The ETIC 12 is configured to generate a number of first ET voltages $V_{CCOA-1}$-$V_{CCOA-N}$ at a number of first output nodes $N_{A1-1}$-$N_{A1-N}$, respectively. The ETIC 12 is also configured to generate a second ET voltage $V_{CCDA}$ at a second output node $N_{A2}$. The ETIC 12 generates both the first ET voltages $V_{CCOA-1}$-$V_{CCOA-N}$ and the second ET voltage $V_{CCDA}$ based on a time-variant ET target voltage $V_{TGT4}$, also sometimes referred to as Vramp. For a detailed description on specific embodiments of the ETIC 12 that generate the first ET voltages $V_{CCOA-1}$-$V_{CCOA-N}$ and the second ET voltage $V_{CCDA}$ based on the time-variant ET target voltage $V_{TGT4}$, please refer to U.S. patent application Ser. No. 17/142,507, now U.S. Pat. No. 11,677,365, entitled "ENVELOPE TRACKING POWER MANAGEMENT APPARATUS INCORPORATING MULTIPLE POWER AMPLIFIERS."

The target voltage circuit 14 is configured to generate the time-variant ET target voltage $V_{TGTA}$ based on an input signal 20, which can be a modulated carrier signal at millimeter wave (mmWave) frequency, intermediate frequency (IF), or In-phase/Quadrature (I/Q) baseband frequency. In a non-limiting example, the target voltage circuit 14 includes an amplitude detection circuit 22 and an analog lookup table (LUT) 24. The amplitude detection circuit 22 is configured to detect a number of time-variant amplitudes 26 of the input signal 20 and the analog LUT 24 is configured to generate the time-variant ET target voltage $V_{TGTA}$ based on the time-variant amplitudes 26.

Figure 2:
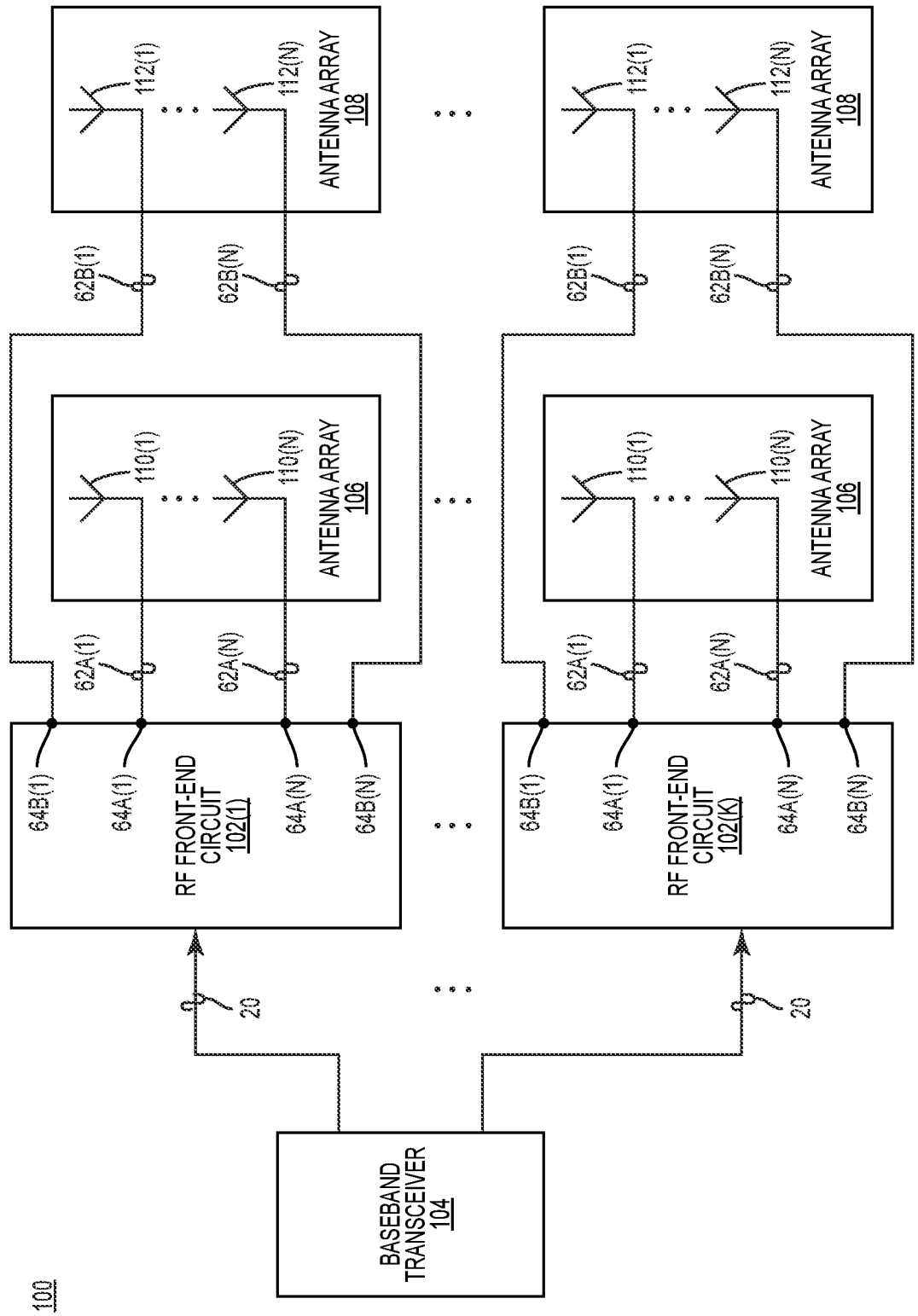
FIG. 2 is a schematic diagram of a wireless device including a number of the ET RF front-end circuits of FIG. 1.

One or more of the ET RF front-end circuit 10 of FIG. 1 can be provided in a wireless device (e.g., a smartphone) to help enhance RF performance and user experience. In this regard, FIG. 2 is a schematic diagram of a wireless device 100 that includes a number of ET RF front-end circuits 102(1)-102(K), which can be any of the ET RF front-end circuit 10 of FIG. 1. Common elements between FIGS. 1 and 2 are shown therein with common element numbers and will not be re-described herein.

The wireless device 100 includes a baseband transceiver 104 that is separated from any of the ET RF front-end circuits 102(1)-102(K). The baseband transceiver 104 is configured the generate the input signal 20.

Each of the ET RF front-end circuits 102(1)-102(K) is coupled to a first antenna array 106 and a second antenna array 108. The first antenna array 106 includes a number of first antennas 110(1)-110(N), each coupled to a respective one of antenna ports 64A(1)-64A(N) and configured to radiate a respective one of RF signals 62A(1)-62A(N) in a first polarization (e.g., horizontal polarization). The second antenna array 108 includes a number of second antennas 112(1)-112(N), each coupled to a respective one of second antenna ports 64B(1)-64B(N) and configured to radiate a respective one of second RF signals 62B(1)-62B(N) in a second polarization (e.g., vertical polarization).

The ET RF front-end circuits 102(1)-102(K) may be disposed in different locations in the wireless device 100 to help enhance RF performance and improve user experience. For example, some of the ET RF front-end circuits 102(1)-102(K) may be provided on a top edge of the wireless device 100, while some of the ET RF front-end circuits 102(1)-102(K) are provided on a bottom edge of the wireless device 100.

Figure 3A:
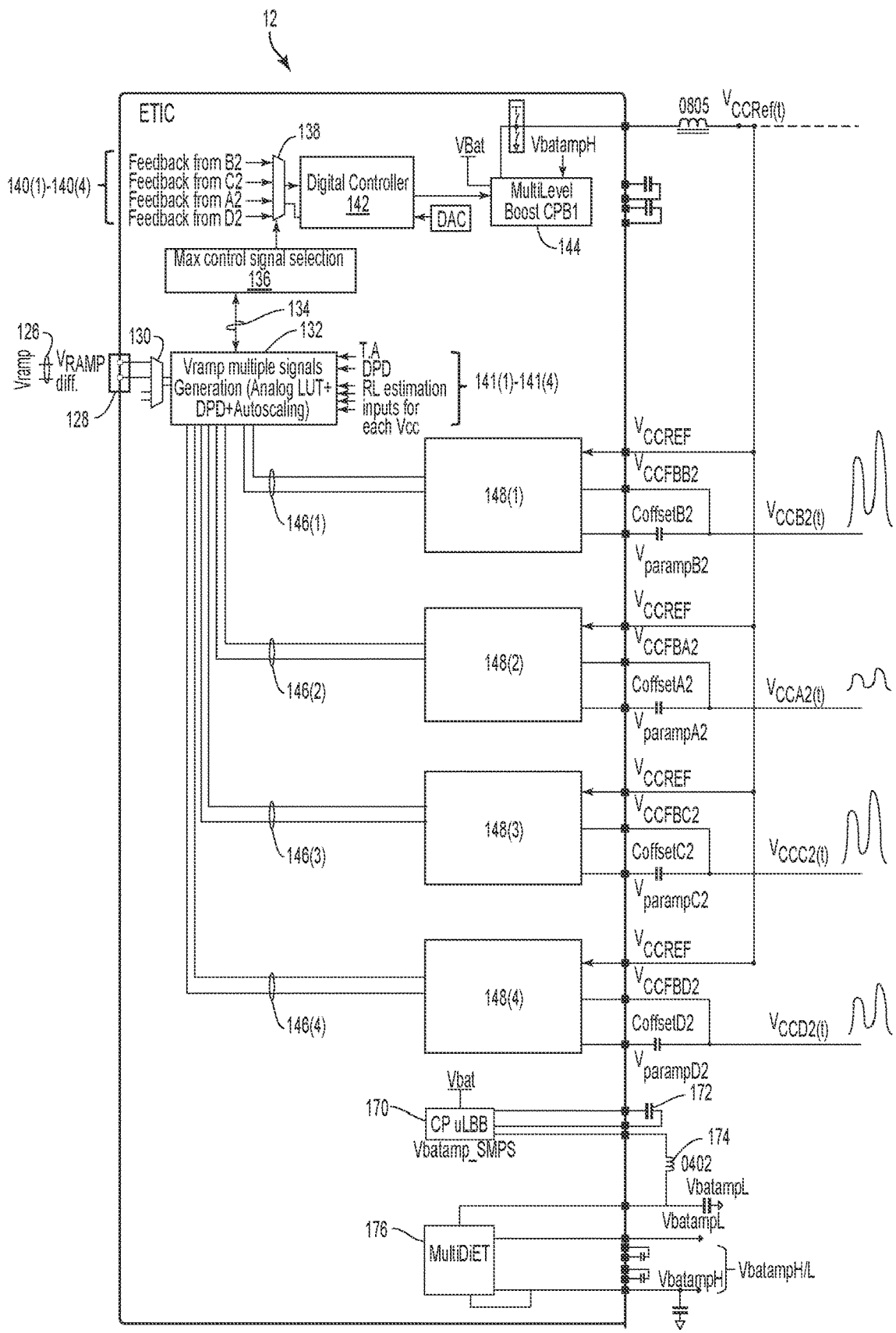
FIGS. 3A and 3B are collectively a schematic diagram of the details of an ETIC such as is used in the RF front-end circuit of FIG. 1 that estimates loads on power amplifiers using sensed current and voltage to derive control signals for the power amplifiers.
Figure 3B:
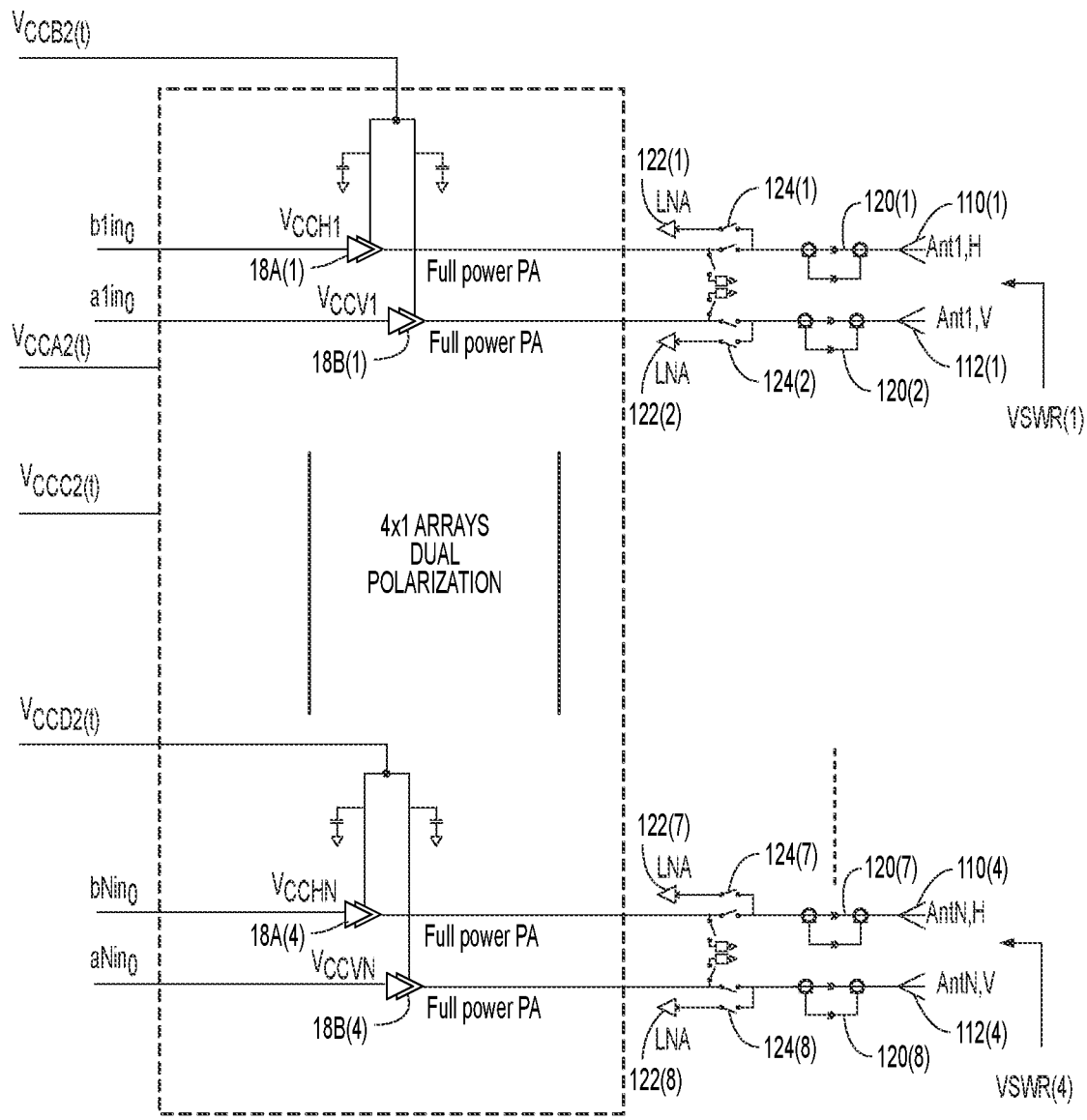

FIG. 3A provides details for the ETC 12 of FIG. 1 as it interrelates to the power amplifiers 18A(1)-18A(N) or 18B(1)-18B(N) illustrated in FIG. 3B. In an exemplary aspect, and as illustrated in FIG. 3B, N=4 and power amplifiers 18A(1)-18A(4) operate for a vertical polarization while power amplifiers 18B(1)-18B(4) operate for a horizontal polarization. The power amplifiers 18A(1)-18A(4) provide amplified signals to the respective antennas 110(1)-110(4) to transmit, for example, horizontally polarized signals. Similarly, the power amplifiers 18B(1)-18B(4) provide amplified signals to the respective antennas 112(1)-112(4) to transmit, for example, vertically polarized signals. The antennas 110(1)-110(4), 112(1)-112(4) may be coupled to the respective power amplifiers 18A(1)-18A(4), 18B(1)-18B(4) through a conductor 120(1)-120(8), which may be a flexible line or the like. Optional grounding circuits 122(1)-122(8) may be provided and selectively connected to the conductors 120(1)-120(8) by respective switches 124(1)-124(8).

With reference to FIG. 3A, the ETIC 12 receives a signal Vramp 126, which may be a differential signal (and corresponds to $V_{TGTA}$) from a baseband transceiver such as the baseband transceiver 104 of FIG. 2. The signal 126 is received at an input 128 and provided to a multiplexer 130 before being provided to a Vramp multiple signal generator circuit 132. The multiple signal generator circuit 132 generates a first output signal 134 to a maximum control signal selection circuit 136. The maximum control signal selection circuit 136 controls a multiplexer 138 to select between feedback signals 140(1)-140(4). The selected signal is provided to a controller circuit 142. Based on the selected signal, the controller circuit 142 controls a multilevel boost circuit 144. The multilevel boost circuit 144 is coupled to power source such as a battery (e.g., Vbat) to produce a reference voltage signal $V_{CCRef}(t)$.

The multiple signal generator circuit 132 also receives a digital pre-distortion (DPD) signal as well as load feedback signals 141(1)-141(4), which represent estimated loads seen by the power amplifiers. Primarily based on the signal 126 and the load feedback signals 141(1)-141(4), the multiple signal generator circuit 132 generates control signals 146(1)-146(4), which may be differential signals. The control signals 146(1)-146(4) are provided to respective conditioning circuits 148(1)-148(4).

Figure 4:
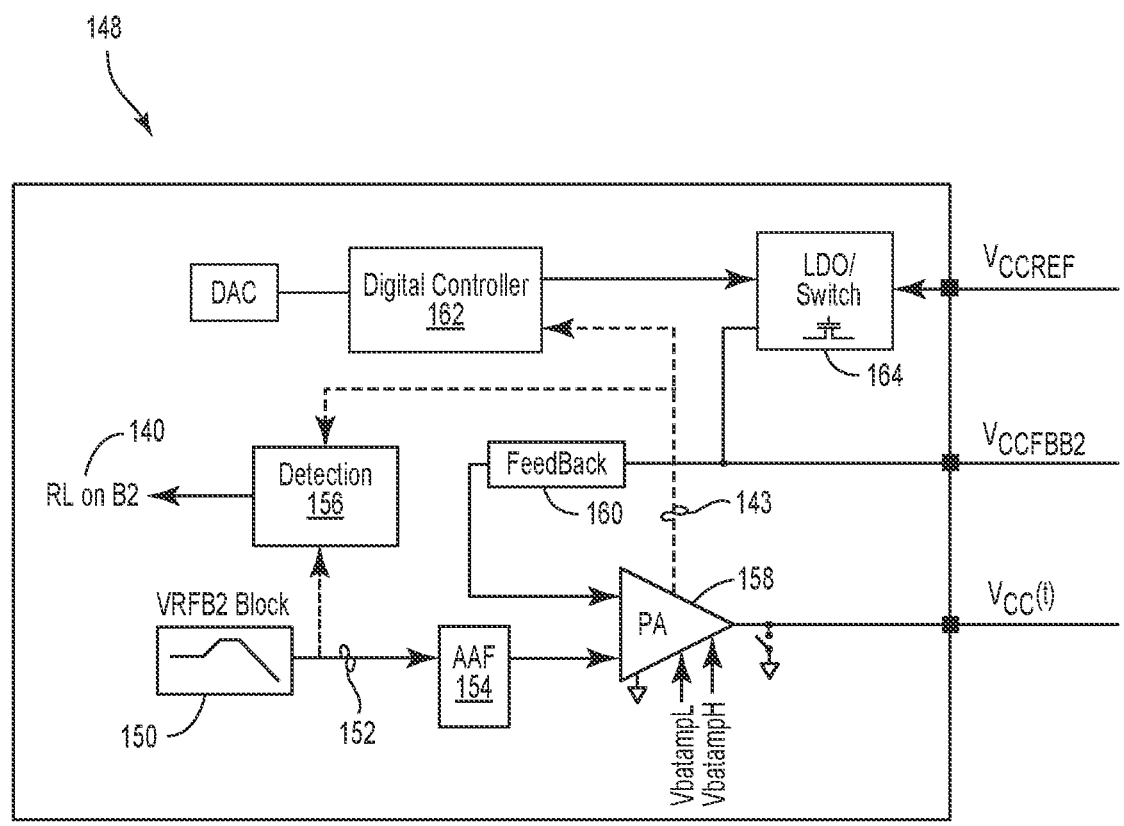
FIG. 4 is a more detailed schematic diagram of a conditioning circuit that measures voltage and current to assist in load estimation for derivation of the control signals for the power amplifiers.

A conditioning circuit 148 corresponding to each conditioning circuit 148(1)-148(4) is illustrated in FIG. 4 and includes a blocking circuit 150, which acts as a bandpass filter to produce a filtered signal 152. The filtered signal 152 is provided to an anti-aliasing filter (AAF) 154 as well as used by a detection circuit 156 that detects current. The detection circuit 156 also receives a feedback signal 143 and generates the load feedback signal 141.

The AAF 154 is coupled to an amplifier 158 that produces the target input signal Vcc(t). Target input signals VccA2(t)-VccD2(t) are provided to the power amplifiers 18A(1)-18A(4), 18B(1)-18B(4). A feedback circuit 160 is coupled to the power amplifier 158.

A control circuit 162 controls a low drop out (LDO)/switch circuit 164. The control circuit 162 also receives the feedback signal 143. The LDO/switch circuit 164 receives the reference voltage $V_{CCRef}$ and selectively couples to the feedback circuit 160, which in turn supplies a signal to the power amplifier 158 as previously described. Note further, feedback circuits 160(1)-160(4) also provide the feedback signals 140(1)-140(4) to the multiplexer 138 (FIG. 3A).

Returning to FIG. 3A, the ETIC 12 may further include a charge pump circuit 170 coupled to a battery voltage (Vbat) and a capacitor 172 to boost the voltage level. The charge pump circuit 170 is also coupled to an inductor 174 which provides a signal to a control circuit 176. The control circuit 176 produces voltage signals for the horizontal (VbatampH) and vertical (VbatampL) polarizations that are provided to the amplifier 158 where noted.

Figure 5:
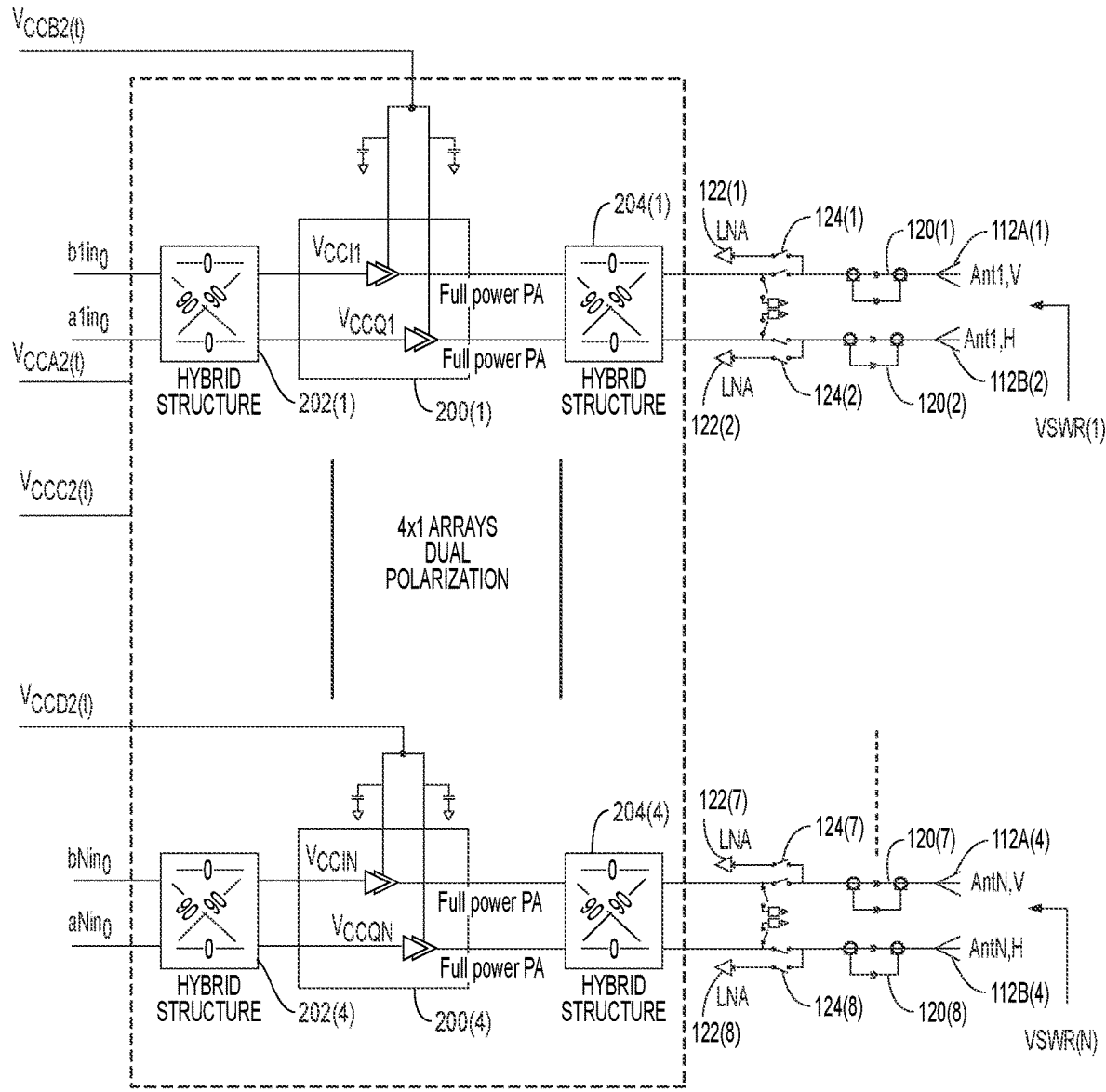
FIG. 5 is a schematic diagram of the details of a power amplifier array similar to that of FIG. 3B, but operating with quadrature signals.

FIG. 5 illustrates a substantially identical set of power amplifiers that serves quadrature amplifiers 200(1)-200(4). The primary difference being the presence of hybrid structures 202(1)-202(4) and 204(1)-204(4).

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (IC) (ETIC) comprising:
   an input configured to receive a vramp signal from a baseband transceiver;
   an output configured to provide a target input signal to a power amplifier array;

a multiple signal generator circuit coupled to the input and configured to generate a control signal based on the received vramp signal and an estimated load for the power amplifier array; and a conditioning circuit coupled to the multiple signal generator circuit, the conditioning circuit configured to receive the control signal, the conditioning circuit comprising a detection circuit configured to detect a current and a voltage to derive the estimated load to be provided to the multiple signal generator circuit.

2. The ETIC of claim 1, wherein the conditioning circuit comprises a bandpass filter configured to filter the control signal.

3. The ETIC of claim 1, wherein the conditioning circuit comprises an amplifier configured to amplify the control circuit to produce the target input signal.

4. The ETIC of claim 3, further comprising a feedback circuit coupled to the amplifier and configured to receive the target input signal.

5. The ETIC of claim 4, further comprising a low drop out (LDO) circuit coupled to the feedback circuit.

6. The ETIC of claim 4, further comprising a reference voltage circuit coupled to the multiple signal generator circuit and the conditioning circuit;

the reference voltage circuit configured to generate a reference voltage for the conditioning circuit.

7. The ETIC of claim 6, wherein the reference voltage circuit is coupled to the feedback circuit.

8. The ETIC of claim 1, further comprising a plurality of conditioning circuits each coupled to the multiple signal generator circuit.

9. The ETIC of claim 8, wherein the multiple signal generator circuit is configured to generate respective control signals for each of the plurality of conditioning circuits.

10. The ETIC of claim 8, wherein the multiple signal generator circuit is configured to receive estimated loads from each of the plurality of conditioning circuits.

11. A wireless device comprising:
a baseband transceiver configured to produce a vramp signal;
an envelope tracking (ET) integrated circuit (IC) (ETIC) coupled to the baseband transceiver, the ETIC comprising:
an input configured to receive the vramp signal from the baseband transceiver;
an output configured to provide a target input signal to a power amplifier array;
a multiple signal generator circuit coupled to the input and configured to generate a control signal based on the received vramp signal and an estimated load for the power amplifier array; and
a conditioning circuit coupled to the multiple signal generator circuit, the conditioning circuit configured to receive the control signal, the conditioning circuit comprising a detection circuit configured to detect a current and a voltage to derive the estimated load to be provided to the multiple signal generator circuit; and
the power amplifier array coupled to the ETIC.

12. The wireless device of claim 11, further comprising a plurality of antennas coupled to the power amplifier array.

13. The wireless device of claim 11, wherein the conditioning circuit comprises a bandpass filter configured to filter the control signal.

14. The wireless device of claim 11, wherein the conditioning circuit comprises an amplifier configured to amplify the control signal to produce the target input signal.

15. The wireless device of claim 14, further comprising a feedback circuit coupled to the amplifier and configured to receive the target input signal.

16. The wireless device of claim 15, further comprising a low drop out (LDO) circuit coupled to the feedback circuit.

17. The wireless device of claim 15, further comprising a reference voltage circuit coupled to the multiple signal generator circuit and the conditioning circuit;
the reference voltage circuit configured to generate a reference voltage for the conditioning circuit.

18. The wireless device of claim 17, wherein the reference voltage circuit is coupled to the feedback circuit.

19. The wireless device of claim 11, further comprising a plurality of conditioning circuits each coupled to the multiple signal generator circuit.

20. The wireless device of claim 19, wherein the multiple signal generator circuit is configured to generate respective control signals for each of the plurality of conditioning circuits.

* * * * *